(12) United States Patent
Summerfelt et al.

(10) Patent No.: US 11,834,331 B2
(45) Date of Patent: Dec. 5, 2023

(54) MEMS ENCAPSULATION EMPLOYING LOWER PRESSURE AND HIGHER PRESSURE DEPOSITION PROCESSES

(71) Applicant: Texas Instruments Incorporated, Dallas, TX (US)

(72) Inventors: Scott Robert Summerfelt, Garland, TX (US); Adam Joseph Fruehling, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 55 days.

(21) Appl. No.: 17/514,282

(22) Filed: Oct. 29, 2021

(65) Prior Publication Data
US 2022/0324702 A1 Oct. 13, 2022

Related U.S. Application Data

(60) Provisional application No. 63/171,805, filed on Apr. 7, 2021.

(51) Int. Cl.
| B81C 1/00 | (2006.01) |
| B81B 7/00 | (2006.01) |
| H01H 45/02 | (2006.01) |
| H01H 1/00 | (2006.01) |

(52) U.S. Cl.
CPC ........ B81C 1/00333 (2013.01); B81B 7/0077 (2013.01); H01H 45/02 (2013.01); B81B 2203/0315 (2013.01); B81C 2203/019 (2013.01); B81C 2203/0136 (2013.01); H01H 1/0036 (2013.01)

(58) Field of Classification Search
None
See application file for complete search history.

(56) References Cited

U.S. PATENT DOCUMENTS

| 7,038,470 B1 * | 5/2006 | Johnson | ............... | G01N 27/226 250/390.05 |
| 7,985,659 B1 * | 7/2011 | Hayes | .................. | B81B 7/0041 438/456 |

(Continued)

FOREIGN PATENT DOCUMENTS

CN 113830724 A * 12/2021

OTHER PUBLICATIONS

Wang, Minrui et al. "STI HARP Gap-filled Thickness Uniformity Improvement for 14nm Nodes." 2018 IEEE, ASMC 2918. pp. 386-389.

(Continued)

Primary Examiner — Michael Lebentritt
(74) Attorney, Agent, or Firm — Michelle F. Murray; Frank D. Cimino

(57) ABSTRACT

A micro-electromechanical system (MEMS) device includes a moveable element within a cavity. The MEMS device also includes a first layer over the cavity, the first layer having a first hole and a second hole. The first hole has a first diameter. The second hole has a second diameter. The second diameter is larger than the first diameter, and the second hole is farther from the moveable element than the first hole. The first hole is sealed with a first dielectric material. The second hole is sealed with a second dielectric material. The cavity filled with a gas at a pressure of at least approximately 10 torr.

20 Claims, 4 Drawing Sheets

(56) References Cited

U.S. PATENT DOCUMENTS

| | | | | |
|---|---|---|---|---|
| 8,686,428 B1* | 4/2014 | Sekar | ............... | H01L 21/76898 |
| | | | | 257/713 |
| 2006/0246631 A1* | 11/2006 | Lutz | ..................... | B81C 1/0096 |
| | | | | 438/127 |
| 2016/0075554 A1* | 3/2016 | Huang | ............... | B81C 1/00285 |
| | | | | 438/51 |

OTHER PUBLICATIONS

Fujino, K. et al. "Low-Temperature CVD Using TEOS and Ozone." J. Electrochem. Soc., vol. 137, No. 9, Sep. 1990. pp. 2883-2887.

Homma, T. et al. "A Fully Planarized Multilevel Interconnection Technology Using Semi-Selective Tetraethoxysilane-Ozone Chemical Vapor Deposition at Atmospheric Pressure." J. Electrochem. Soc. 140, pp. 3591-3599.

Gillot, C. et al. "Wafer Level Thin Film Encapsulation for MEMS." 2005 Electronics Packaging Technology Conference. pp. 243-247.

Bo Woon Soon, J. et al. "Hermetic Wafer Level Thin Film Packaging for MEMS." 2016 IEEE 66th Electronic Components and Technology Conference, pp. 857-862. DOI 19.1109/ECTC.2016.317.

Yuan, Z. et al. "Optimization of SiO2 film conformality in TEOS/O3 APCVD." Thin Solid Films 290-291 (1996) pp. 422-426.

Morris, A. et al. "Commercial CMOS-Integrated RF-MEMS." ECS Transaction, 53 (3) 255-263 (2013).

\* cited by examiner

MEMS ENCAPSULATION EMPLOYING LOWER PRESSURE AND HIGHER PRESSURE DEPOSITION PROCESSES

CROSS-REFERENCE TO RELATED APPLICATIONS

This application claims priority to U.S. Provisional Application No. 63/171,805, filed Apr. 7, 2021, which is hereby incorporated by reference.

BACKGROUND

A micro-electromechanical system (MEMS) device is a structure that has an internal cavity in which an active element is able to move under the influence of, for example, a mechanical force, an electrical voltage or current, etc. To protect the active element within the MEMS device, the cavity in which the active element resides is sealed with a protective cap. The cavities of at least some MEMS devices are sealed with a particular gas (e.g., an inert gas) at a pressure within a particular range of pressures.

SUMMARY

In one example, a method is described for forming a micro-electromechanical system (MEMS) device having a MEMS structure. The method includes forming a first hole through a first dielectric layer. The first hole has a first diameter. The method further includes forming a second hole through the first dielectric layer. The second hole has a second diameter that is larger than the first diameter. The method also includes performing a first sealing process with a first gas at a first pressure to completely seal the first hole but not the second hole, and then performing a second sealing process with a second gas at a second pressure to completely seal the second hole.

In another example, a micro-electromechanical system (MEMS) device includes a moveable element within a cavity. The MEMS device also includes a first layer over the cavity, the first layer having a first hole and a second hole. The first hole has a first diameter. The second hole has a second diameter. The second diameter is larger than the first diameter, and the second hole is farther from the moveable element than the first hole. The first hole is sealed with a first dielectric material. The second hole is sealed with a second dielectric material. The cavity filled with a gas at a pressure of at least approximately 10 torr.

BRIEF DESCRIPTION OF THE DRAWINGS

For a detailed description of various examples, reference will now be made to the accompanying drawings in which.

DETAILED DESCRIPTION

Figure 1:
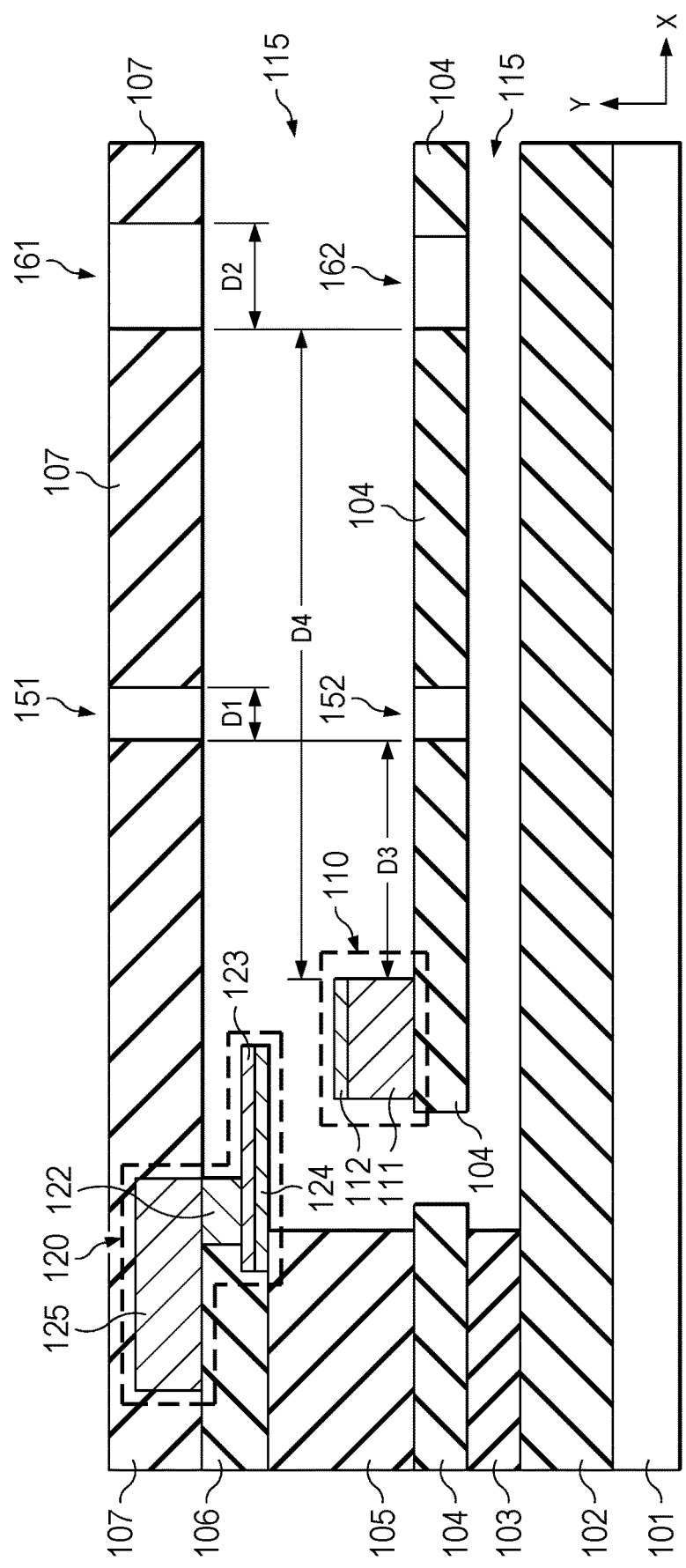
FIG. 1 is a side cut-away view of a MEMS device during construction of the MEMS device.

The same reference number is used in the drawings for the same or similar (either by function and/or structure) features.

In some applications, the moveable element of a MEMS device has a metal surface that should be free of any dielectric material. For example, a MEMS relay device has a metal element that may move in response to electrostatic actuation, thermal actuation, magnetic actuation, or piezoelectric actuation to thereby contact a corresponding fixed metal element. An electric circuit is completed upon the two metal elements contacting each other. The surfaces of the elements should not have any dielectric material thereon. Inadvertent dielectric material will otherwise increase the resistance of the metal contacts thereby increasing the temperature of the device and decreasing the current flow through therethrough. Accordingly, during the processing of the wafer to seal the cavity in which the moveable element is located, the sealing process itself should not contaminate the active elements (e.g., the moveable element) of the MEMS device.

Per Paschen's Law is an equation that provides the breakdown voltage necessary to start a discharge or electric arc between two electrodes in a gas a function of pressure and gap length. In general, the breakdown voltage increases with increasing pressure. In an example application of a MEMS relay, the breakdown voltage should be high enough to avoid an electric arc between the relay's metal elements. Accordingly, lower pressures may undesirably result in inadvertent electric arcing for a given gas within the sealed MEMS cavity. Additionally, in some applications (e.g., MEMS relays) the pressure at which the MEMS cavity is sealed should be high enough to avoid arcing.

Chemical Vapor Deposition (CVD) is a process by which deposition occurs when a gas contains all or part of the chemicals (precursor) that you want to end up on the wafer surface. In some cases, multiple gasses may be used to create the composition that is desired. For example, TEOS plus oxygen (O2) or SiH4+O2 is frequently used to create silicon dioxide (SiO2) films. Alternatively, silicon nitride (SiN) can be created by combining SiH4 or SiCl4 plus N2 or NH3. The reaction can sometimes be created using heat from the process or added energy can be achieved by a plasma or ultra-violet (UV) light for example. This is typically used for plasma enhanced CVD or PECVD. The CVD reactor can be horizontal or vertical. The gas movement, pressure, and distribution are optimized for the film properties, uniformity and repeatability. Different types of CVD processes are available to seal a MEMS device. Examples of CVD-related sealing processes include Plasma Enhanced CVD (PECVD), Atmospheric Pressure CVD (APCVD), and Subatmospheric CVD (SACVD).

PECVD is a low temperature (e.g., approximately 100-400 degrees Celsius) deposition process, high film density deposition technique in which a plasma is used. The plasma is a partially ionized gas with a high free electron content (e.g., approximately 50%). Within a deposition chamber, a radio-frequency (RF) or microwave voltages are applied to electrodes above and even below the wafer. The RF energy charges the electrons within the plasma and maintains them in an excitable state in order to deposit the desired film. The film may be, for example, silicon nitride (SiN), silicon dioxide (SiO2), silicon oxy-nitride (SiON), silicon carbide (SiC), and amorphous silicon (a-Si). The PECVD deposition process can be used to seal a MEMS device but at relatively low pressures (e.g., approximately 50 mTorr to 1 Torr).

APCVD is a deposition process in which the wafer is exposed to one or more volatile precursors at approximately atmospheric pressure. Like other CVD processes, APCVD utilizes a precursor gas inside the deposition chamber. The temperature slowly rises to catalyze the reactions on the wafer surface and deposit a thin film. Typical types of films deposited using this process include silicon oxides and silicon nitrides. The APCVD deposition process can seal a MEMS device at a higher pressure than the PECVD deposition process, but the film deposited per the APCVD may extend a fairly long distance into the MEMS cavity being sealed.

SACVD differs from other CVD processes because it takes place below standard room pressure and uses ozone ($O_3$) to help catalyze the reaction. The deposition process takes place at a higher pressure than LPCVD but lower than APCVD, for example, between about 13,300 Pa and 80

There exists low temperature CVD of SiO2 using a APCVD or Sub-Atmosphereic CVD process. This process is unique it that it combines a silicon (Si) source (typically TEOS) with a reactive O2 gas (typically ozone=O3) to catalyze low temperature reaction. The deposition process takes place at a higher pressure than PECVD and is typically greater than 10 Torr and potentially even up to 1 atmosphere (760 Torr) or even higher if the equipment makes this possible. SACVD films can have a high deposition rate, which improves as temperature increases until about 490° C., at which point the deposition rate begins to decrease. One characteristic of this process is it has very good step coverage, which means that the deposition rate does not vary much even with narrow aspect ratio. In the case of MEMS devices this means that SiO2 will be deposited even at regions in the undercut region that have no exposure to the hole in the vertical direction and just from the lateral direction. Advantageously, however, the amount of film decreases at farther distances from the hole, but the amount of film may still be much more than that produced by other deposition techniques. Another CVD process with excellent step coverage is atomic layer deposition (ALD), which is a process that typically uses reactive gasses such as ozone or water vapor as well and typical deposition temperatures are also fairly low (around 200 degrees C. to 350 degrees C.). The deposition rate of ALD films is typically very low so ALD is generally not adequate for sealing holes because of the low wafer throughput creating an expensive process for thick films.

Some types of MEMS devices (e.g., MEMS relays) should be (a) sealed at relatively high pressures to achieve a high enough breakdown voltage to reduce the risk of arcing and (b) sealed without contaminating the surfaces the active components with dielectric. PECVD is a relatively clean deposition process in that the active elements of the MEMS structure are not likely to be contaminated, but the sealing pressures of PECVD may be too low to achieve the breakdown voltages desired. APCVD achieves sufficiently high sealing pressures but may contaminate the active elements of the MEMS device.

The embodiments described herein are directed to a MEMS sealing technique which results in a sealed MEMS cavity at a sufficiently high pressure to achieve adequate breakdown voltage levels while also avoiding the risk of the active elements of the MEMS device from being contaminated by dielectric by the sealing process itself. In one example, holes having a first diameter are formed near the active elements of the MEMS devices. These holes are usable to perform an undercut process to form the active element of the MEMS device. Further, additional holes having a second diameter (larger than the first diameter) are formed farther from the active elements than the first diameter holes. The smaller diameter holes are sealed by a low pressure, but clean, PECVD deposition process. Then, the larger diameter holes are sealed by a higher pressure, but dirtier, APCVD deposition process. The larger diameter holes are far enough from the active elements of the MEMS device to avoid contaminating the surfaces of the active elements.

Figure 2:
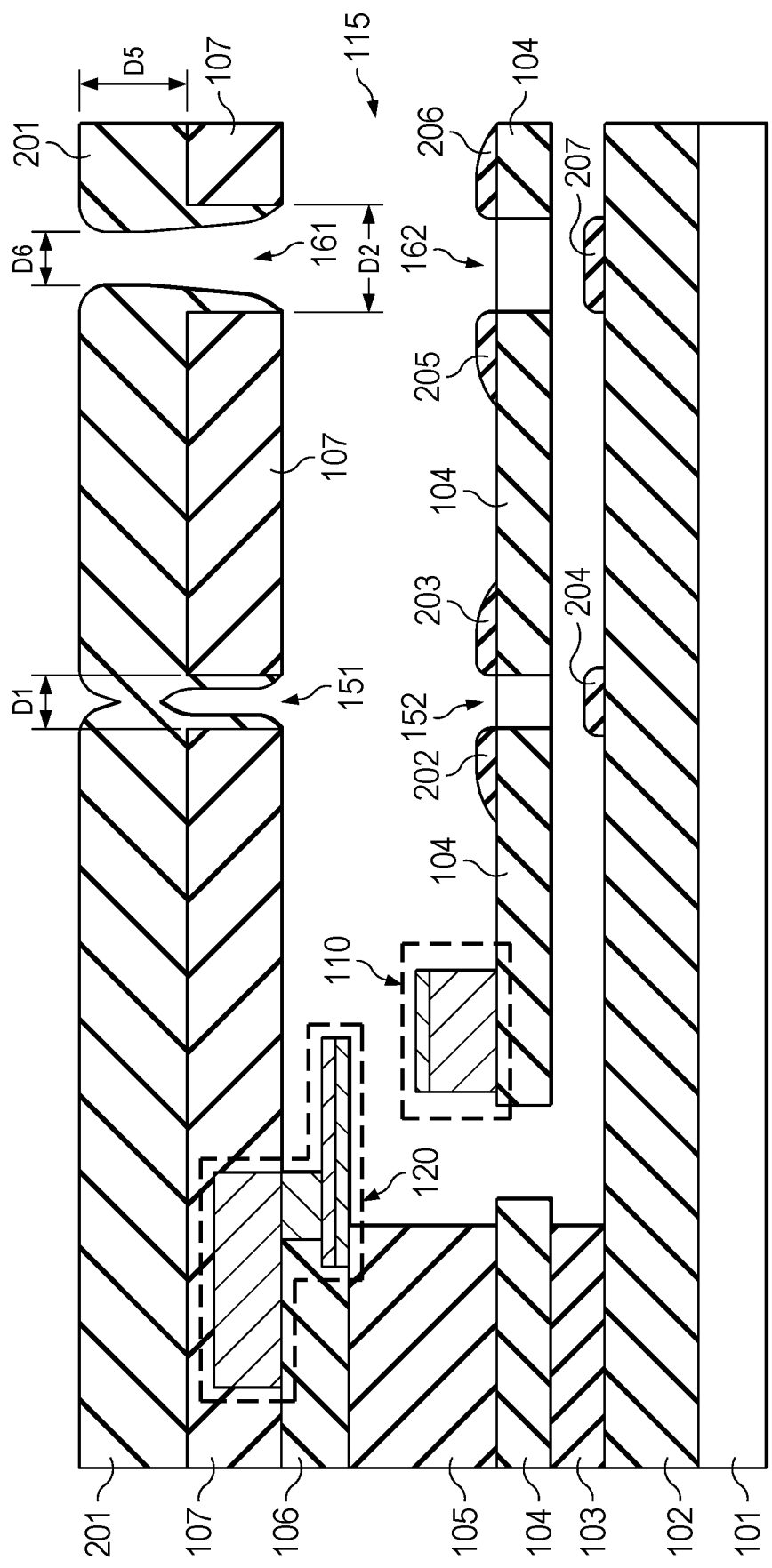
FIG. 2 is a side cut-away view of the MEMS after performance of a Plasma Enhanced Chemical Vapor (PECVD) deposition process in which smaller diameter holes close to the active element of the MEMS device are sealed with a dielectric.
Figure 3:
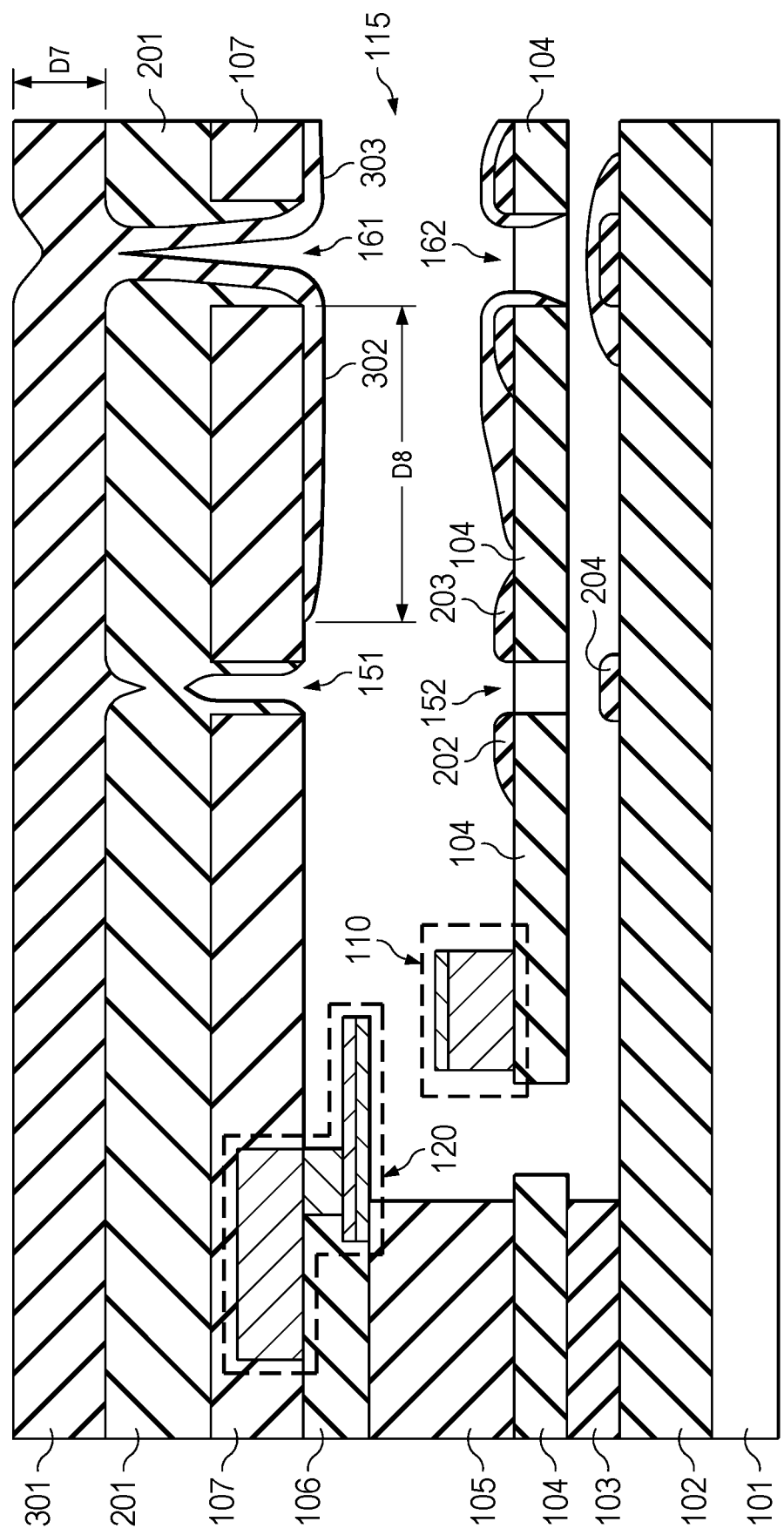
FIG. 3 is a side cut-away view of the MEMS after performance of an Atmospheric Pressure Enhanced Chemical Vapor (APCVD) deposition process in which larger diameter holes farther from the active element of the MEMS device are sealed with a dielectric.

FIGS. 1-3 are cross-sectional views of a substrate on which a MEMS device is formed and sealed in accordance with the disclosed sealing technique. In FIG. 1, the base MEMS device has been formed on the substrate 101. The structure shown in FIG. 1 includes a substrate 101 on which layers 102-107 have been formed. In one embodiment, layers 102, 104, and 107 are SiO2 and layers 103, 105, and 106 are SiN. Layers 103, 105, and 106 are sacrificial layers in that at least a portion of those layers is removed. One more vertically-aligned holes 151 and 152 and vertically-aligned holes 161 and 162 have been formed through layers 107 and 104, respectively, through which an undercut process is performed to remove parts of sacrificial layers 103, 105, and 106 to thereby form a cavity 115.

The active elements of the MEMS device include moveable element 110 and fixed element 120. In one embodiment, before sacrificial layer 105 is formed, a metal contact 111 is formed (e.g., through a deposition process using a mask) on layer 104. In one example, metal contact 111 includes aluminum, but can be a metal other than aluminum in other examples or even a complex multilayer of different materials. A layer 112 is formed on an upper surface of the metal contact 111. In examples in which layer 112 is part of a electrical contact then this layer is typically a noble metal or conductive oxide. Example metals are ruthenium (Ru), ruthenium dioxide (RuO2), iridium (Ir), IrOx, platinum (Pt), gold (Au), silver (Ag), rhodium (Rh), AuRh, PtIr. If the environment is clean enough, it might even be refractory metals such tungsten (W), molybdenum (Mo), tantalum (Ta), tungsten nitride (WN), tantalum nitride (TaN), titanium nitride (TiN), TiW, TiWN, MoN, WN. Once metal contact 111 and 112 are patterned and formed as shown, sacrificial layer 105 is then formed thereon. Example sacrificial layers include SiN, SiO2, Si, or polymer such as photoresist or polyimide. In some embodiments, the sacrificial is an insulator. In particular, the sacrificial layer may be a patterned Si layer.

The fixed element 120 includes a metal contact 125, which might be the same type of materials as the bottom contact, such as a noble metal, conductive oxide or refractory metals or metal compounds. In some cases, the material of the fixed element is different than that of the bottom connect to improve the ability of the contact to resist welding due to current flow. The materials above the contact material are materials that help improve stability for subsequent layers. For example, layer 122 may be iridium oxide (IrOx) and in which case layer 123 might be Ir with the top layer titanium nitride (TiN) or titanium-aluminum-nitride (TiAlN). These layers may contain low resistance materials such as copper (Cu) or aluminum (Al). The goal is for these top layers not to be altered (e.g., removed) by the undercut process and make a satisfactory connection to metals from above. Layer 125 comprises a metal (e.g., Cu or other suitable metal) to provide a low resistance path. These structures are formed via, for example, deposition processes in which the structures are patterned using masks. Sacrificial layer 106 is formed after layers 123 and 124 and are formed. Sacrificial layer 106 may be the same material as the previously mentioned sacrificial layer. Metal contact 125 is formed on top of sacrificial layer 106.

After metal contact 125 is formed, barrier layer 107 is formed thereon. Barrier layer 107 layer comprise a material that is not significantly altered by the process used to remove the sacrificial layers used to create the MEMS device. An example process for forming the barrier layer 107 and sacrificial layers 105 and 106 is as follows. If the sacrificial layer material comprises SiO2, then the barrier layer may be a dielectric such as SiN or AlOx and a vapor HF or wet HF containing undercut process. If the sacrificial layer 105, 106 is SiN then the barrier layer may comprise SiO2 or aluminum oxide (AlOx) and an undercut process may be employed using plasma enhanced undercut etch of CF4+O2. Holes 151 and 161 are formed in barrier layer 107 via, for example, a resist coat, photolithography, resist develop, appropriate bakes, and plasma etch process followed by resist ash and a wet clean process. As mentioned previously the holes are created by the same process but they are different sizes. The diameter of holes 151 and 152 is D1, and the diameter of holes 161 and 162 is D2. In at least one embodiment, D2 is larger than D1. In one example, D1 is in the range of approximately 0.4 to 0.8 microns, and D2 is in the range of approximately 1 to 1.5 microns. Additionally, holes 151 and 152 are a lateral distance D3 (approximately 2-6 microns) from the moveable element 110, while holes 161 and 162 are a distance D4 (approximately 20-500 microns) from the moveable element 110. In the embodiment of FIG. 1, D4 is larger than D3 and thus larger diameter holes 161 and 162 are farther from the moveable element 110 than smaller diameter holes 151 and 152.

An undercut process is then performed to remove at least a part of sacrificial layers 103 and 105. As mentioned above, the undercut process depends on the barrier and sacrificial layers chosen.

The resulting structure in FIG. 1 includes metal contacts 125 and 111. Metal contact 111 is part of the moveable element 110, which moves vertically (y-direction) under the influence of electrostatic actuation, thermal actuation, magnetic actuation or piezoelectric actuation. In accordance with the disclosed embodiments, the cavity 115 is then sealed at sufficiently high pressure to achieve a satisfactorily high breakdown voltage (e.g., greater than 100V/micron gap space) while also avoiding contaminating (e.g., with a dielectric) the active elements of the MEMS device which include the moveable element 110 and the fixed element 120.

In FIG. 2, a PECVD deposition process is performed to deposit a dielectric layer 201 on layer 107. In one example, the dielectric layer 201 is SiO2 or SiN, but can be other types of dielectric material (e.g., SiON, SiC, a-Si). The PECVD deposition process is performed for a period of time to deposit a dielectric layer 201 thick enough to seal the smaller diameter hole 151, but not thick enough to also seal the larger diameter hole 161. In general, to seal a hole having a diameter of n microns, the thickness of the dielectric layer should be in the range of 1 micron to 3 microns (one to three times the diameter of the hole to be sealed). In an example in which the diameter D1 of hole 151 is approximately 0.5 microns and the diameter D2 of hole 161 is approximately 1 micron, the thickness D5 of dielectric layer 201 deposited via the PECVD process is in a range of approximately 1 to 3 microns. FIG. 2 shows that hole 151 has been sealed with dielectric layer 201, but larger diameter hole 161 has not been sealed. The dielectric material of layer 201 has been deposited into the hole 161 thereby effectively narrowing its diameter from D2 to D6 (D6 is smaller than D2).

The PECVD deposition process results in some dielectric material flowing through holes 151 and 152 onto the surfaces of layers 104 and 102. Dielectric material 202 and 203 is shown deposited around hole 152 and dielectric material 204 is shown deposited on the surface of layer 102 below hole 152. To the extent that dielectric material flows through the holes 151 and 152 onto the surfaces of layers 104 and 102 as a result of the PECVD deposition process, the dielectric material is still far enough away from the active elements (moveable element 110 and fixed element 120) of the MEMS device so as not to contaminate the active elements. Similarly, dielectric material flows through holes 161 and 162 resulting in a deposition of dielectric material 205, 206 and 207 as shown, but since holes 161 and 162 are even farther away from the active elements of the MEMS device, the risk of contaminating the active elements is even lower.

Hole 151 is used during the undercut process to form the MEMS structure itself, and thus hole 151 is relatively close to the active elements of the MEMS device. The PECVD deposition process is used to seal the hole 151 relatively close to the active elements of the MEMS device but is not used to also seal the larger diameter holes because the PECVD deposition process may not achieve the heightened sealing pressure desired for the breakdown voltage desired.

In FIG. 3, an APCVD deposition process is performed to seal hole 161. A dielectric layer 301 is deposited on the surface of dielectric layer 201 through the APCVD process. The APCVD process can achieve an adequate sealing pressure (e.g., approximately 1 atmosphere) for the target breakdown voltage. In one example, an inert gas such as nitrogen or argon is inserted into the cavity 115 and sealed by the APCVD deposition process at a pressure in a range of approximately 300 Torr to 760 Torr. The thickness of the resulting dielectric layer 301 is D7. The thickness D7 of dielectric layer 301 is large enough to completely seal hole 161 whose diameter had been narrowed (from D2 to D6) during the previous PECVD deposition process. In an example, in which D6 is approximately 0.5 to 1.5 microns, D7 is in the range of approximately 1 micron to 3 microns. In one example, dielectric layer 301 is SiO2. In other examples, dielectric layer may be SiN or another suitable dielectric. In one embodiment dielectric layers 201 and 301 are SiN and SiO2, respectively. In another embodiment, dielectric layers 201 and 301 are both SiN. In some cases, additional layers are added such as AlOx or SiN or SiON. Such added layers may be useful as mechanical or moisture barriers.

The APCVD process is a "dirtier" process than the PECVD process meaning that dielectric material from the APCVD process tends to be deposited further from holes 161 and 162 than was the case for the dielectric material deposited during the PECVD process. For example, dielectric material 302 and 303 form on the underside of surface 107 (within the cavity 115) a distance D8 from hole 161 whereas D8 is substantially a larger distance than dielectric material 202 and 203 forms from hole 152 during the PECVD deposition process.

Figure 4:
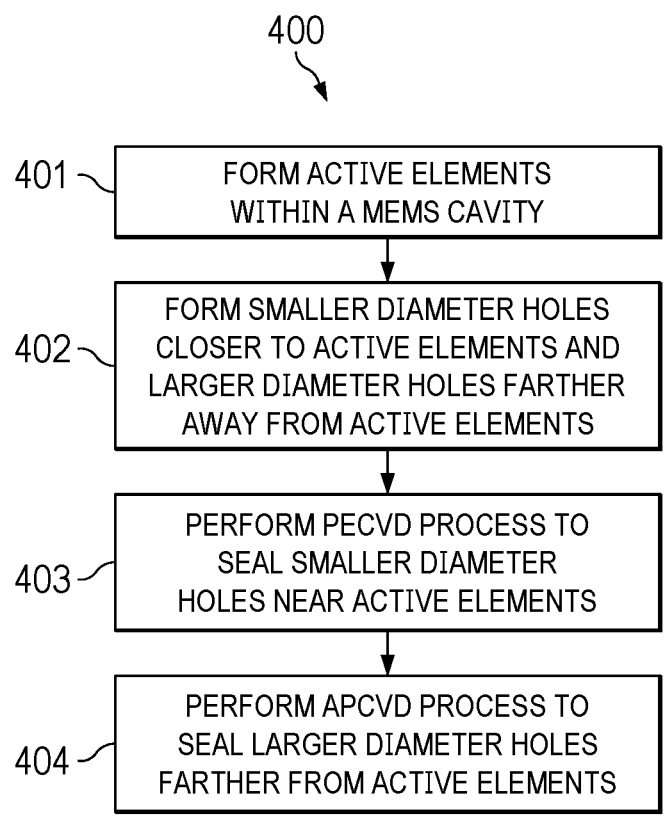
FIG. 4 is a flowchart of a method for forming the MEMS device illustrated herein.

FIG. 4 is an example method 400 for forming a MEMS device in accordance with the disclosed embodiments. At step 401, the method includes forming the active elements with the MEMS cavity. FIG. 1 shows the active elements to be moveable element 110 and fixed element 120. The active elements may be used to form a MEMS relay as noted above, but the overall function to be performed by the MEMS device is irrelevant to the scope of this disclosure.

At step 402, one or more smaller diameter holes (e.g., hole 151) are formed close to the active elements and larger diameter holes (e.g., hole 161) are formed farther from the active elements. Holes 151 and 161 (and corresponding vertically-aligned holes 152 and 162) may be used to perform an undercut process to fully form the MEMS cavity as explained previously.

At 403, the method includes performing the PECVD deposition process to seal the smaller holes near the active elements, but not seal the larger holes. The PECVD deposition process may be used to deposit a dielectric such as SiO2, SiN, or another suitable dielectric. At 404, the method 300 includes performing the APCVD process to seal the larger diameter hole (e.g., hole 161) farther from the active elements. The APCVD deposition process may be used to deposit a dielectric such as SiN or another suitable dielectric.

Unless otherwise stated, "about," "approximately," or "substantially" preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. A method comprising:
    forming a first hole through a layer on a micro-electromechanical system (MEMS) device, the first hole having a first diameter;
    forming a second hole through the layer, the second, hole having a second diameter larger than the first diameter;
    performing a first sealing process with a first gas at a first pressure to seal the first hole; and
    performing a second sealing process with a second gas at a second pressure to seal the second hole.

2. The method of claim 1, wherein the first sealing process includes a plasma enhanced chemical vapor deposition process.

3. The method of claim 2, wherein the second sealing process includes an atmospheric pressure chemical vapor deposition process.

4. The method of claim 1, wherein the second sealing process includes an atmospheric pressure chemical vapor deposition process.

5. The method of claim 1, wherein forming the first and second holes comprises forming the second hole farther away from a movable element of the MEMS device than the first hole.

6. The method of claim 1, wherein:
    performing the first sealing process with the first gas at the first pressure includes performing a plasma enhanced chemical vapor deposition process at a pressure in a range of 50 mtorr to 1 torr; and
    performing the second sealing process with the second gas at the second pressure includes performing an atmospheric chemical vapor deposition process at a pressure in a range of 300 torr to 760 torr.

7. The method of claim 1, wherein the MEMS device includes a relay.

8. A micro-electromechanical system (MEMS) device, comprising:
    a moveable element within a cavity;
    a layer over the cavity, the layer having a first hole and a second hole, the first hole having a first diameter, the second hole having a second diameter, the second diameter larger than the first diameter, and the second hole farther from the moveable element than the first hole;
    a first dielectric material on the layer covering the first hole; and
    a second dielectric material on the first dielectric material covering the second hole.

9. The MEMS device of claim 8, wherein the layer is a first layer, the MEMS device further comprises a second layer in the cavity, and the movable element is on an end of the second layer.

10. The MEMS device of claim 9, wherein the second layer and the movable element is part of a relay, and the movable element includes a metal contact.

11. The MEMS device of claim 10, wherein the metal contact is a first metal contact, and the MEMS device further comprises a second metal contact extending from a side of the cavity, the first metal contact movable towards or away from the second metal contact.

12. The MEMS device of claim 8, wherein the first dielectric material covers a first part of the second hole, and the second dielectric material covers a second part of the second hole.

13. The MEMS device of claim 8, wherein the first dielectric material and the second dielectric material are different.

14. The MEMS device of claim 8, wherein the first dielectric material and the second dielectric material include at least one of: Silicon Dioxide, Silicon Nitride, Aluminum Oxide, silicon oxy-nitride, silicon carbide, or amorphous silicon.

15. The MEMS device of claim 8, wherein the first hole has a diameter in a range of 0.4 to 0.8 microns, and the second hole has a diameter in a range of 1 to 1.5 microns.

16. The MEMS device of claim 8, wherein the cavity is filled with a gas having a pressure of 10 Torr or above.

17. The method of claim 1, wherein the first hole has a diameter in a range of 0.4 to 0.8 microns, and the second hole has a diameter in a range of 1 to 1.5 microns.

18. The method of claim 1, wherein performing a first sealing process with a first gas at a first pressure comprises performing the first sealing process to covering a first part of the second hole; and
    wherein performing a second sealing process with a second gas at a second pressure comprises performing the second sealing process to cover a second part of the second hole.

19. The method of claim 1, further comprising: performing an undercut process using at least one of the first or second holes.

20. The method of claim 1, wherein the layer is on a cavity, and the method further comprises removing sacrificial materials from the cavity using at least one of the first or second holes.

* * * * *